US012805169B2

(12) United States Patent
Yuan et al.

(10) Patent No.: US 12,805,169 B2
(45) Date of Patent: Nov. 17, 2026

(54) OLED DISPLAY PANEL, MANUFACTURING METHOD THEREOF AND OLED DISPLAY DEVICE

(71) Applicants: WUHAN CHINA STAR OPTOELECTRONICS TECHNOLOGY CO., LTD., Wuhan (CN); WUHAN CHINA STAR OPTOELECTRONICS SEMICONDUCTOR DISPLAY TECHNOLOGY CO., LTD., Wuhan (CN)

(72) Inventors: Tao Yuan, Wuhan (CN); Jinchang Huang, Wuhan (CN)

(73) Assignees: WUHAN CHINA STAR OPTOELECTRONICS TECHNOLOGY CO., LTD., Wuhan (CN); WUHAN CHINA STAR OPTOELECTRONICS SEMICONDUCTOR DISPLAY TECHNOLOGY CO. LTD., Wuhan (CN)

( * ) Notice: Subject to any disclaimer, the term of this patent is extended or adjusted under 35 U.S.C. 154(b) by 1027 days.

(21) Appl. No.: 17/429,159

(22) PCT Filed: May 31, 2021

(86) PCT No.: PCT/CN2021/097516
§ 371 (c)(1),
(2) Date: Nov. 24, 2022

(87) PCT Pub. No.: WO2022/241835
PCT Pub. Date: Nov. 24, 2022

(65) Prior Publication Data

US 2024/0040914 A1 Feb. 1, 2024

(30) Foreign Application Priority Data

May 21, 2021 (CN) ......................... 202110557958.0

(51) Int. Cl.
*H10K 59/30* (2023.01)
*H10K 59/12* (2023.01)
(Continued)

(52) U.S. Cl.
CPC ..... *H10K 59/8791* (2023.02); *H10K 59/1201* (2023.02); *H10K 59/1213* (2023.02);
(Continued)

(58) Field of Classification Search
CPC ........... H10K 59/8791; H10K 59/1201; H10K 59/1213; H10K 59/122; H10K 59/353;
(Continued)

(56) References Cited

U.S. PATENT DOCUMENTS

2016/0149165 A1* 5/2016 Kim ..................... H10K 59/121 257/40
2021/0066418 A1* 3/2021 Seo ........................ H10K 59/88
2021/0351241 A1* 11/2021 Cho ..................... H10K 59/121

FOREIGN PATENT DOCUMENTS

CN 110211972 A 9/2019
CN 110323259 A 10/2019
(Continued)

*Primary Examiner* — Samuel Park

(57) ABSTRACT

An OLED display panel, a manufacturing method thereof, and an OLED display device are disclosed. The OLED display panel includes a first display area and a second display area located in the first display area, and further includes a substrate, a TFT array layer, a plurality of light-emitting sub-pixels, and a common layer, wherein at least one blind hole is defined between the light-emitting sub-pixels located in the second display area, the blind hole
(Continued)

penetrates through the TFT array layer, and the blind hole is at least partially filled with an organic layer.

15 Claims, 2 Drawing Sheets

(51) Int. Cl.

| | |
|---|---|
| ***H10K 59/121*** | (2023.01) |
| ***H10K 59/122*** | (2023.01) |
| ***H10K 59/35*** | (2023.01) |
| ***H10K 59/80*** | (2023.01) |
| *H10K 59/65* | (2023.01) |

(52) U.S. Cl.
CPC ......... *H10K 59/122* (2023.02); *H10K 59/353* (2023.02); *H10K 59/65* (2023.02)

(58) Field of Classification Search
CPC ...... H10K 59/65; H10K 59/121; H10K 59/00; H10K 59/12
See application file for complete search history.

(56) References Cited

FOREIGN PATENT DOCUMENTS

| | | | | | |
|---|---|---|---|---|---|
| CN | 110491910 | A | | 11/2019 | |
| CN | 110556404 | A | | 12/2019 | |
| CN | 111029385 | A | | 4/2020 | |
| CN | 111062367 | A | * | 4/2020 | ......... G06V 40/1324 |
| CN | 111063717 | A | | 4/2020 | |
| CN | 111370441 | A | | 7/2020 | |
| CN | 112531127 | A | | 3/2021 | |

* cited by examiner

OLED DISPLAY PANEL, MANUFACTURING METHOD THEREOF AND OLED DISPLAY DEVICE

FIELD OF INVENTION

The present disclosure relates to the field of display technology, and more particularly, to an OLED display panel and an OLED display device.

BACKGROUND OF INVENTION

With the progress of display technology, various display devices are developing toward the direction of high screen-to-body ratios. In order to enhance the screen-to-body ratio of a display panel, many manufacturers set a notch at an upper edge of the screen to place a communication module and a camera module. However, such designs still require a considerable display area, which is still quite different from the idea of a real full screen.

Afterwards, O-notch screens appear. By drilling a hole in the display panel and setting the camera in the hole, the screen-to-body ratio is further enhanced.

In order to achieve a real full screen design, it is necessary to place the camera under the OLED display panel. When the camera is not activated, the screen displays normally. When the camera is activated, the camera can take pictures. In order to achieve effective photographing, the film layer which covers the camera is required to have great transmittance. However, due to the shielding effect of the OLED display panel on the camera, the entry of external light into the camera may be greatly affected, which affects the amount of light collected by the camera. Therefore, it is necessary to improve this defect.

SUMMARY OF INVENTION

Technical Problem

The present disclosure provides an OLED display panel, a manufacturing method thereof, and an OLED display device for solving the technical problem that the amount of light collected by the camera is decreased due to the shielding effect of the OLED display panel to external light in the condition that the camera is placed under the OLED display panel in order to realize the real full screen design in the existing technology.

Technical Solutions

An embodiment of the present disclosure provides an OLED display panel including a first display area and a second display area located in the first display area. The OLED display panel further includes a substrate, a TFT array layer located on the substrate, a plurality of light-emitting sub-pixels located on the TFT array layer, and a common layer located on the plurality of light-emitting sub-pixels. At least one blind hole is defined between the light-emitting sub-pixels located in the second display area, the blind hole penetrates through the TFT array layer, and the blind hole is at least partially filled with an organic layer.

In the OLED display panel provided by the embodiment of the present disclosure, a bottom of the blind hole is located on a surface of a side of the substrate close to the TFT array layer In the OLED display panel provided by the embodiment of the present disclosure, the OLED display panel further includes a planarization layer located between the TFT array layer and the plurality of light-emitting sub-pixels, a pixel electrode layer between the planarization layer and the plurality of light-emitting sub-pixels, and a pixel definition layer located on the planarization layer and the pixel electrode layer.

In the OLED display panel provided by the embodiment of the present disclosure, the blind hole penetrates through the planarization layer and the pixel definition layer.

In the OLED display panel provided by the embodiment of the present disclosure, the common layer corresponding to an area of the blind hole is located on a bottom of the blind hole, and the organic layer is located on the common layer In the OLED display panel provided by the embodiment of the present disclosure, the blind hole penetrates through the common layer, and the blind hole is fully filled with the organic layer.

In the OLED display panel provided by the embodiment of the present disclosure, a cross-sectional shape of the blind hole is one or more of a circle, a rounded rectangle, a rectangle and an ellipse.

In the OLED display panel provided by the embodiment of the present disclosure, the plurality of light-emitting sub-pixels include a plurality of red sub-pixels, a plurality of green sub-pixels, and a plurality of blue sub-pixels, wherein the plurality of red sub-pixels and the plurality of blue sub-pixels located in the second display area are jointly arranged in even rows and odd columns, the red sub-pixels and the blue sub-pixels are alternately arranged in any of the rows or and any of the columns, and the plurality of green sub-pixels located in the second display area are arranged in odd rows and even columns In the OLED display panel provided by the embodiment of the present disclosure, the blind hole includes a plurality of first blind holes located in the odd columns and a plurality of second blind holes located in the even columns, any of the first blind holes is located between the blue sub-pixel and the red sub-pixel, and any of the second blind holes is located between two of the green sub-pixels, wherein a cross-sectional area of the second blind hole is greater than a cross-sectional area of the first blind hole.

An embodiment of the present disclosure provides a manufacturing method of an OLED display panel, the OLED display panel including a first display area and a second display area located in the first display area, wherein the manufacturing method includes steps:

S1. providing a substrate;

S2. manufacturing a TFT array layer on the substrate;

S3. manufacturing at least one blind hole on the TFT array layer corresponding to a non-pixel area of the second display area, wherein the blind hole penetrates through the TFT array layer;

S4. manufacturing a plurality of light-emitting sub-pixels on the TFT array layer corresponding to a pixel area;

S5. manufacturing a common layer on the plurality of light-emitting sub-pixels, wherein the blind hole is at least partially filled with an organic layer.

In the manufacturing method of the OLED display panel provided by the embodiment of the present disclosure, wherein between the step S2 and the step S3, the method further includes steps of: manufacturing a planarization layer on the TFT array layer; manufacturing a pixel electrode layer on the planarization layer; manufacturing a pixel definition layer on the planarization layer and the pixel electrode layer, wherein the pixel definition layer is configured to define the pixel area.

In the manufacturing method of the OLED display panel provided by the embodiment of the present disclosure, the blind hole penetrates through the pixel definition layer, the planarization layer, and the TFT array layer; the common layer corresponding to an area of the blind hole area is located on a bottom of the blind hole; the organic layer is filled on the common layer corresponding to the area of the blind hole.

An embodiment of the present disclosure further provides an OLED display device including an OLED display panel and an optical element, wherein the OLED display panel includes a first display area and a second display area located in the first display area. The OLED display panel further includes a substrate, a TFT array layer located on the substrate, and a plurality of light-emitting sub-pixels on the TFT array layer, and a common layer on the plurality of light-emitting sub-pixels. At least one blind hole is defined between the light-emitting sub-pixels located in the second display area. The blind hole penetrates through the TFT array layer, and the blind hole is at least partially filled with an organic layer. The optical element is located below the OLED display panel and is disposed corresponding to the second display area.

In the OLED display device provided by the embodiment of the present disclosure, a bottom of the blind hole is located on a surface of a side of the substrate close to the TFT array layer.

In the OLED display device provided by the embodiment of the present disclosure, the OLED display panel further includes a planarization layer located between the TFT array layer and the plurality of light-emitting sub-pixels, a pixel electrode layer between the planarization layer and the plurality of light-emitting sub-pixels, and a pixel definition layer located on the planarization layer and the pixel electrode layer In the OLED display device provided by the embodiment of the present disclosure, the blind hole penetrates through the planarization layer and the pixel definition layer.

In the OLED display device provided by the embodiment of the present disclosure, the common layer corresponding to an area of the blind hole is located on a bottom of the blind hole, and the organic layer is located on the common layer.

In the OLED display device provided by the embodiment of the present disclosure, the blind hole penetrates through the common layer, and the blind hole is fully filled with the organic layer.

In the OLED display device provided by the embodiment of the present disclosure, a cross-sectional shape of the blind hole is one or more of a circle, a rounded rectangle, a rectangle and an ellipse.

Beneficial Effect:

The present disclosure provides an OLED display panel, a manufacturing method thereof, and an OLED display device. The OLED display panel includes a first display area and a second display area located in the first display area. The OLED display panel further includes a substrate, a TFT array layer located on the substrate, a plurality of light-emitting sub-pixels located on the TFT array layer, and a common layer located on the plurality of light-emitting sub-pixels. At least one blind hole is defined between the light-emitting sub-pixels located in the second display area, the blind hole penetrates through the TFT array layer, and the blind hole is at least partially filled with an organic layer. In the present disclosure, at least one blind hole is defined between the light-emitting sub-pixels located in the second display area, in which the blind hole penetrates through the TFT array layer, and the blind hole is at least partially filled with an organic layer. In comparison with the TFT array layer, the organic layer has higher transmittance. By substituting the organic layer for the TFT array layer, the transmittance of the second display area cab be enhanced, so as to increase the amount of light collected by the camera.

DETAILED DESCRIPTION OF PREFERRED EMBODIMENTS

Figure 1:
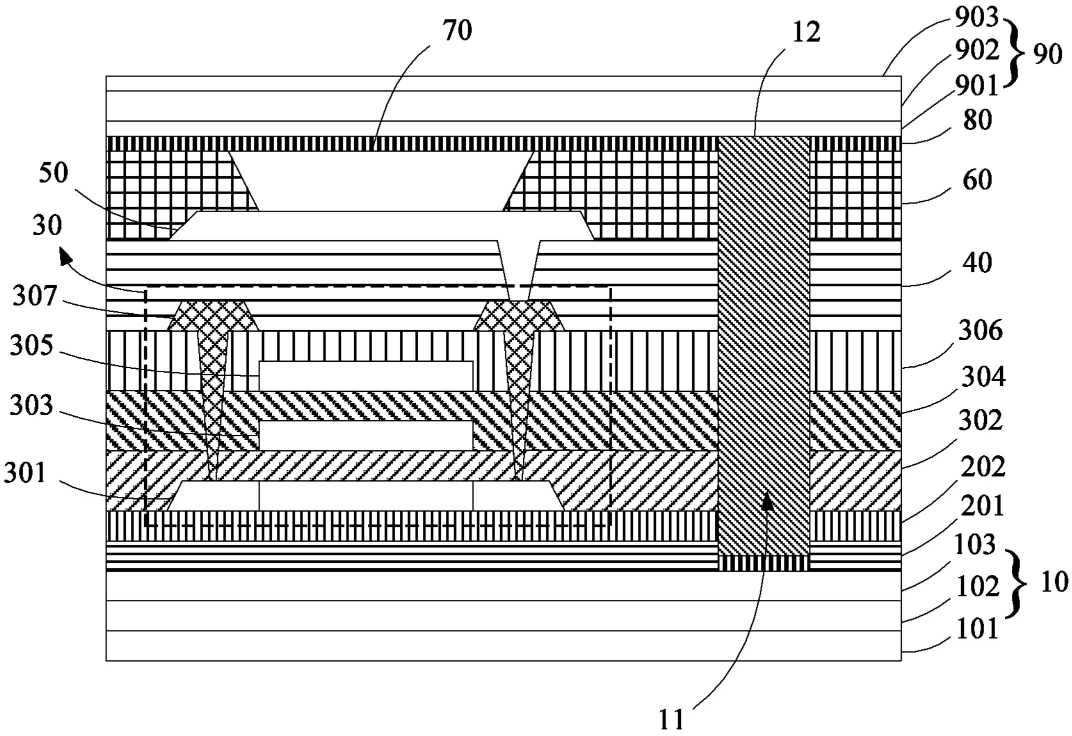
FIG. 1 is a basic structural diagram of a second display area of an OLED display panel provided by embodiments of the present disclosure.

In order to make the purpose, technical solution and effect of the present disclosure clearer and more definite, the present disclosure is further described in detail with reference to the attached drawings and embodiments. In the drawings, for clarity and ease of understanding and describing, the dimensions and thickness of the components shown in the drawings are not scaled.

An embodiment of the present disclosure provides an OLED display panel, in which the OLED display panel includes a first display area and a second display area located in the first display area, and the second display area is correspondingly provided with a camera (not shown). As shown in FIG. 1, which illustrates a basic structural diagram of the second display area of the OLED display panel provided by the embodiment of the present disclosure. The OLED display panel includes a substrate 10, a TFT array layer 30 located on the substrate 10 (the TFT array layer 30 includes a plurality of TFTs, and only one TFT is illustrated in FIG. 1 as an example), a plurality of light-emitting sub-pixels 70 located on the TFT array layer 30 (only one light-emitting sub-pixel is illustrated in FIG. 1 as an example), and a common layer 80 located on the plurality of light-emitting pixels 70. At least one blind hole 11 is defined between the plurality of light-emitting sub-pixels 70 in the second display area. The blind hole 11 penetrates through the TFT array layer 30, and the blind hole 11 is at least partially filled with an organic layer 12.

It should be noted that in order to achieve a true full screen, it is necessary to place the camera under the OLED display panel. However, due to the shielding effect of the film layer of the OLED display panel, the amount of light collected by the camera is reduced. In the embodiment of the present disclosure, at least one blind hole 11 is defined between the light-emitting sub-pixels 70 in the second display area (i.e., the placement area of the camera). The blind hole 11 penetrates through the TFT array layer 30, and the blind hole 11 is at least partially filled with the organic layer 12. Compared with the TFT array layer 30, the organic layer 12 has higher transmittance. In the embodiment of the present disclosure, the organic layer 12 is substituted for the TFT array layer 30, which can enhance the transmittance of the second display area, so that the amount of light collected by the camera can be increased.

In one embodiment, the substrate 10 includes a first substrate layer 101, a first barrier layer 102, and a second substrate layer 103, which are laminated. In the embodiment of the present disclosure, by disposing two substrate layers, the waterproofing effect of the OLED display panel is enhanced and the invasion of external water vapor is prevented from affecting the device performance of the TFT array layer 30. The first substrate layer 101 and the second substrate layer 103 may be flexible substrates, for example, may be made of polyimide materials.

In one embodiment, the bottom of the blind hole 11 is located on one side of the substrate 10 close to the TFT array layer 30. Specifically, a buffer layer 201 is further disposed between the substrate 10 and the TFT array layer 30, and a second barrier layer 202 is disposed between the buffer layer 201 and the TFT array layer 30. The blind hole 11 penetrates through not only the TFT array layer 30, but also the second barrier layer 202 and the buffer layer 201, which can further improve the transmittance of the second display area.

In one embodiment, the OLED display panel further includes a planarization layer 40 located between the TFT array layer 30 and the plurality of light-emitting sub-pixels 70, a pixel electrode layer 50 located between the planarization layer 40 and the plurality of light-emitting sub-pixels 70, and a pixel definition layer 60 located on the planarization layer 40 and the pixel electrode layer 50.

It should be noted that the TFT array layer 30 includes a plurality of TFTs, each of which includes an active layer 301, a first gate insulation layer 302 disposed on the active layer 301, a first gate layer 303 disposed on the first gate insulation layer 302, a second gate insulation layer 304 disposed on the first gate layer 303, a second gate layer 305 disposed on the second gate insulation layer 304, an interlayer dielectric layer 306, an interlayer insulation layer 306 disposed on the second gate layer 305, and a source/drain metal layer 307 disposed on the interlayer insulation layer 306. The source/drain metal layer 307 is electrically connected to two ends of the active layer 301 through via holes. The pixel electrode layer 50 is electrically connected to the drain of the TFT array layer 30 through a via hole. The TFT array layer 30 is configured to provide a driving current. The pixel electrode layer 50 is configured to output holes according to the driving current. A hole transport layer (not shown) is disposed between the pixel electrode layer 50 and the plurality of light-emitting sub-pixels 70. The holes are transmitted to the light-emitting sub-pixels 70 through the hole transport layer. The common layer 80 includes an electron transport layer and a common electrode layer. The common electrode layer is configured to output electrons. The electrons are transmitted to the light-emitting sub-pixels 70 through the electron transport layer. The electrons and holes are combined to emit light to finish the corresponding image display.

In one embodiment, the blind hole 11 penetrates the planarization layer 40 and the pixel definition layer 60. Specifically, the blind hole 11 is manufactured after manufacturing the pixel definition layer 60 and before manufacturing the light-emitting sub-pixels 70. Therefore, in the present embodiment, after the common layer 80 is manufactured, the common layer 80 corresponding to the area of the blind hole 11 may fall on the bottom of the blind hole 11, and the organic layer 12 is filled on the common layer 80 in the blind hole 11. In other embodiments, the pixel definition layer 60, the light-emitting sub-pixels 70 and the common layer 80 may be manufactured first, and then at least one blind hole 11 may be manufactured between the light-emitting sub-pixels 70 in the second display area. At this time, the blind hole 11 penetrates through the common layer 80, the pixel definition layer 60, the planarization layer 40, and the TFT array layer 30, so that the transmittance of the second display area is further enhanced. At this time, all of the blind holes 11 are fully filled with the organic layer 12.

In one embodiment, a cross-sectional shape of the blind hole 11 is one or more of a circle, a rounded rectangle, a rectangle and an ellipse.

In one embodiment, the OLED display panel further includes a packaging layer 90 disposed on the common layer 80. The packaging layer 90 includes a first inorganic layer 901, an organic packaging layer 902, and a second inorganic layer 903, which are laminated. An inorganic-organic-inorganic three-layer packaging structure is used in the embodiment of the present disclosure, so that the performances of waterproofing and oxygen-barrier of the OLED display panel are further enhanced, thereby preventing the life of the organic light-emitting material of the light-emitting sub-pixels 70 from being shorten due the invasion of external water vapor.

Figure 2:
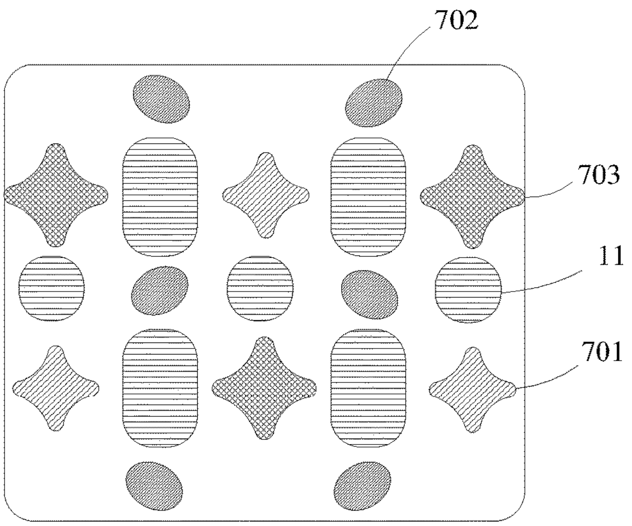
FIG. 2 is a schematic arrangement diagram of a plurality of light-emitting sub-pixels provided by embodiments of the present disclosure.

Next, reference is made to FIG. 2, which illustrates a schematic arrangement diagram of a plurality of light-emitting sub-pixels in the second display area provided by the embodiment of the present disclosure. The light-emitting sub-pixels include a plurality of red sub pixels 701, a plurality of green sub pixels 702, and a plurality of blue sub pixels 703. The red sub pixels 701 and the blue sub pixels 703 located in the second display area are jointly arranged in even rows and odd columns, and the red sub-pixels 701 and the blue sub-pixels 703 are alternately arranged in any of the rows or and any of the columns. The green sub-pixels located in the second display area are arranged in odd rows and even columns.

At least one blind hole 11 is defined between the light-emitting sub-pixels in the second display area. The blind hole 11 includes a plurality of first blind holes in the odd columns and a plurality of second blind holes in the even columns. Any of the first blind holes is located between the blue sub-pixel 703 and the red sub-pixel 701, and any of the second blind holes is located between two of the green sub-pixels 702. The cross-sectional area of the second blind hole is greater than the cross-sectional area of the first blind hole.

It can be understood that the light-emitting efficiency of the blue light-emitting material is significantly lower than the light-emitting efficiency of the green light-emitting material with the same current due to different light-emitting materials. In the embodiment of the present disclosure, the light-emitting area of the blue sub-pixel 703 is designed to be greater than the light-emitting areas of the red sub-pixel 701 and the green sub-pixel 702, so as to balance the light-emitting efficiency of the OLED display panel, thereby slowing down the aging speed of the overall OLED display panel and extending the service time. However, since the light-emitting area of the green sub-pixel 702 is the smallest, the cross-sectional area of the second blind hole between two of the green sub-pixels 702 can be designed to be greater than the cross-sectional area of the first blind hole between the red sub-pixel 701 and the blue sub-pixel 703, so that the transmittance of the second display area of the OLED display panel can be further enhanced.

In one embodiment, the cross-sectional shape of the blind hole 11 is one or more of a circle, a rounded rectangle, a rectangle, and an ellipse.

Figure 3:
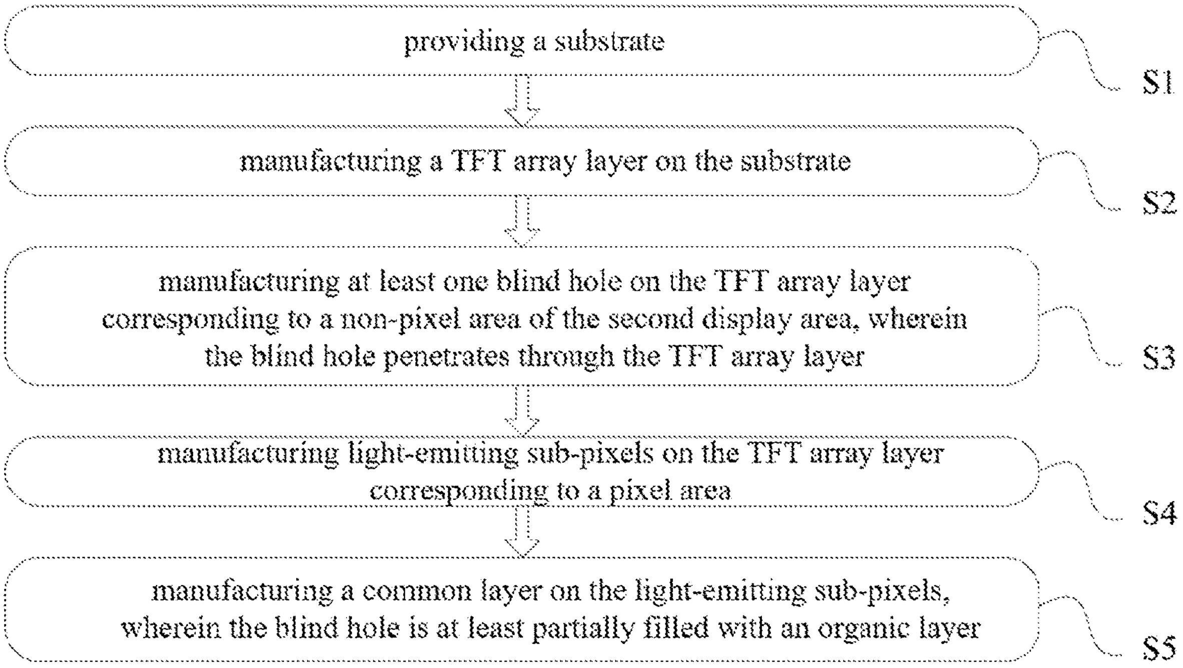
FIG. 3 is a flow chart of a manufacturing method of an OLED display panel provided by embodiments of the present disclosure.

Next, reference is made to FIG. 3, which illustrates a flow chart of a manufacturing method of an OLED display panel provided by the embodiment of the present disclosure. The OLED display panel includes a first display area and a second display area located in the first display area. The manufacturing method includes the following steps:

S1. A substrate is provided;

S2. A TFT array layer is manufactured on the substrate;

S3. At least one blind hole is manufactured on the TFT array layer corresponding to a non-pixel area of the second display area, wherein the blind hole penetrates through the TFT array layer;

S4. A plurality of light-emitting sub-pixels are manufactured on the TFT array layer corresponding to a pixel area;

S5. A common layer is manufactured on the light-emitting sub-pixels, wherein the blind hole is at least partially filled with an organic layer.

It can be understood that, in the embodiment of the present disclosure, at least one blind hole is defined in the non-pixel area (the non-pixel area herein refers to an area between the light-emitting sub-pixels) of the second display area (i.e., the placement area of the camera). The blind hole penetrates through the TFT array layer, and the blind hole is at least partially filled with the organic layer. Compared with the TFT array layer, the organic layer has higher transmittance. In the embodiment of the present disclosure, the organic layer is substituted for the TFT array layer 30, which can enhance the transmittance of the second display area, so that the amount of light collected by the camera can be increased In one embodiment, between the step S2 and the step S3, the method further includes steps of: a planarization layer is manufactured on the TFT array layer; a pixel electrode layer is manufactured on the planarization layer; a pixel definition layer is manufactured on the planarization layer and the pixel electrode layer, wherein the pixel definition layer is configured to define the pixel area.

In one embodiment, the blind hole penetrates the pixel definition layer, the planarization layer, and the TFT array layer. The common layer corresponding to the blind hole area is located on the bottom of the blind hole. The organic layer is filled on the common layer corresponding to the blind hole area.

It can be understood that the blind hole is manufactured after manufacturing the pixel definition layer and before manufacturing the light-emitting sub-pixels. Therefore, in the present embodiment, after the common layer is manufactured, the common layer corresponding to the blind hole area may fall on the bottom of the blind hole, and the organic layer is filled on the common layer in the blind hole. In other embodiments, the pixel definition layer, the light-emitting sub-pixels, and the common layer can also be manufactured first, and then at least one blind hole can be manufactured between the light-emitting sub-pixels in the second display area. At this time, the blind hole penetrates through the common layer, the pixel definition layer, the planarization layer, and the TFT array layer. In other words, the common layer of the blind hole area is removed, such that the transmittance of the second display area can be further enhanced. At this time, all of the blind holes are fully filled with the organic layer.

The embodiment of the present disclosure further provides an OLED display device, which include the aforementioned OLED display panel and an optical element located below the OLED display panel and disposed corresponding to the second display area. Specifically, the optical element may be an element which has to collect light such as a camera. The structure and manufacturing method of the OLED display panel may be referred to FIG. 1 to FIG. 3 and the related descriptions, and the further description is not given herein. The OLED display device provided by the embodiment of the present disclosure may be a mobile phone, a tablet, a notebook, a digital camera, a navigator, and other products or components with display function.

To sum up, the present disclosure provides an OLED display panel. The OLED display panel includes a first display area and a second display area located in the first display area. The OLED display panel further includes a substrate, a TFT array layer located on the substrate, a plurality of light-emitting sub-pixels located on the TFT array layer, and a common layer located on the plurality of light-emitting sub-pixels. At least one blind hole is defined between the light-emitting sub-pixels located in the second display area. The blind hole penetrates through the TFT array layer, and the blind hole is at least partially filled with an organic layer. In the present disclosure, at least one blind hole is defined between the light-emitting sub-pixels located in the second display area, in which the blind hole penetrates through the TFT array layer, and the blind hole is at least partially filled with an organic layer. In comparison with the TFT array layer, the organic layer has higher transmittance. By substituting the organic layer for the TFT array layer, the transmittance of the second display area cab be enhanced, so as to increase the amount of light collected by the camera. Therefore, in the condition that the camera is placed under the OLED display panel in order to realize the real full screen design in the existing technology, the technical problem that the amount of light collected by the camera is decreased due to the shielding effect of the OLED display panel to external light can be solved.

In the aforementioned embodiments, the description of each embodiment has its emphasis. The part not detailed in one embodiment may refer to the related description of other embodiments.

It can be understood that for those skilled in the art, equivalent substitutions or changes can be made according to the technical scheme of the present disclosure and its inventive concept, and all these substitutions or changes should belong to the protection scope of the claims attached to the present disclosure.

What is claimed is:

1. An OLED display panel comprising a first display area and a second display area located in the first display area, wherein the OLED display panel further comprises a substrate, a TFT array layer located on the substrate, a plurality of light-emitting sub-pixels located on the TFT array layer, and a common layer located on the plurality of light-emitting sub-pixels;

wherein at least one blind hole is defined between the light-emitting sub-pixels located in the second display area, the blind hole penetrates through the TFT array layer, and the blind hole is at least partially filled with an organic layer;

wherein the common layer comprises an electron transport layer and a common electrode layer, the common layer corresponding to an area of the blind hole is located on an entirety of a bottom of the blind hole, and the organic layer is filled on the common layer located in the blind hole;

wherein the plurality of light-emitting sub-pixels comprise a plurality of red sub-pixels, a plurality of green sub-pixels, and a plurality of blue sub-pixels, wherein the plurality of red sub-pixels and the plurality of blue sub-pixels located in the second display area are jointly arranged in even rows and odd columns, the red sub-pixels and the blue sub-pixels are alternately arranged in any of the rows or and any of the columns, and the plurality of green sub-pixels located in the second display area are arranged in odd rows and even columns; and wherein the blind hole comprises a plurality of first blind holes located in the odd columns and a plurality of second blind holes located in the even columns, any of the first blind holes is located between the blue sub-pixel and the red sub-pixel, and any of the second blind holes is located between two of the green sub-pixels, wherein a cross-sectional area of the second blind hole is greater than a cross-sectional area of the first blind hole.

2. The OLED display panel according to claim 1, wherein the bottom of the blind hole is located on a surface of a side of the substrate close to the TFT array layer.

3. The OLED display panel according to claim 1, wherein the OLED display panel further comprises a planarization layer located between the TFT array layer and the plurality of light-emitting sub-pixels, a pixel electrode layer between the planarization layer and the plurality of light-emitting sub-pixels, and a pixel definition layer located on the planarization layer and the pixel electrode layer.

4. The OLED display panel according to claim 3, wherein the blind hole penetrates through the planarization layer and the pixel definition layer.

5. The OLED display panel according to claim 1, wherein a cross-sectional shape of the blind hole is one or more of a circle, a rounded rectangle, a rectangle and an ellipse.

6. The OLED display panel according to claim 1, wherein the OLED display panel further comprises a packaging layer disposed on the common layer, and the packaging layer comprises a first inorganic layer, an organic packaging layer, and a second inorganic layer laminated in sequence.

7. The OLED display panel according to claim 1, wherein a light-emitting area of any one of the blue sub-pixels is greater than a light-emitting area of any one of the red sub-pixels or a light-emitting area of any one of the green sub-pixels.

8. A manufacturing method of an OLED display panel, the OLED display panel comprising a first display area and a second display area located in the first display area, wherein the manufacturing method comprises steps:

S1. providing a substrate;

S2. manufacturing a TFT array layer on the substrate;

S3. manufacturing at least one blind hole on the TFT array layer corresponding to a non-pixel area of the second display area, wherein the blind hole penetrates through the TFT array layer;

S4. manufacturing a plurality of light-emitting sub-pixels on the TFT array layer corresponding to a pixel area; and S5. manufacturing a common layer on the plurality of light-emitting sub-pixels, wherein the blind hole is at least partially filled with an organic layer;

wherein the common layer comprises an electron transport layer and a common electrode layer, wherein the common layer corresponding to an area of the blind hole is located on an entirety of a bottom of the blind hole, and the organic layer is filled on the common layer located in the blind hole;

wherein the plurality of light-emitting sub-pixels comprise a plurality of red sub-pixels, a plurality of green sub-pixels, and a plurality of blue sub-pixels, wherein the plurality of red sub-pixels and the plurality of blue sub-pixels located in the second display area are jointly arranged in even rows and odd columns, the red sub-pixels and the blue sub-pixels are alternately arranged in any of the rows or and any of the columns, and the plurality of green sub-pixels located in the second display area are arranged in odd rows and even columns; and wherein the blind hole comprises a plurality of first blind holes located in the odd columns and a plurality of second blind holes located in the even columns, any of the first blind holes is located between the blue sub-pixel and the red sub-pixel, and any of the second blind holes is located between two of the green sub-pixels, wherein a cross-sectional area of the second blind hole is greater than a cross-sectional area of the first blind hole.

9. The manufacturing method of the OLED display panel according to claim 8, wherein between the step S2 and the step S3, the method further comprises steps of:

manufacturing a planarization layer on the TFT array layer;

manufacturing a pixel electrode layer on the planarization layer; and manufacturing a pixel definition layer on the planarization layer and the pixel electrode layer, wherein the pixel definition layer is configured to define the pixel area.

10. The manufacturing method of the OLED display panel according to claim 9, wherein the blind hole penetrates through the pixel definition layer, the planarization layer, and the TFT array layer.

11. An OLED display device comprising an OLED display panel and an optical element, wherein the OLED display panel comprises a first display area and a second display area located in the first display area, the OLED display panel further comprises a substrate, a TFT array layer located on the substrate, and a plurality of light-emitting sub-pixels on the TFT array layer, and a common layer on the plurality of light-emitting sub-pixels;

wherein at least one blind hole is defined between the light-emitting sub-pixels located in the second display area, the blind hole penetrates through the TFT array layer, and the blind hole is at least partially filled with an organic layer;

wherein the common layer comprises an electron transport layer and a common electrode layer, the common layer corresponding to an area of the blind hole is located on an entirety of a bottom of the blind hole, and the organic layer is filled on the common layer located in the blind hole;

the optical element is located below the OLED display panel and is disposed corresponding to the second display area;

wherein the plurality of light-emitting sub-pixels comprise a plurality of red sub-pixels, a plurality of green sub-pixels, and a plurality of blue sub-pixels, wherein the plurality of red sub-pixels and the plurality of blue sub-pixels located in the second display area are jointly arranged in even rows and odd columns, the red sub-pixels and the blue sub-pixels are alternately arranged in any of the rows or and any of the columns, and the plurality of green sub-pixels located in the second display area are arranged in odd rows and even columns; and wherein the blind hole comprises a plurality of first blind holes located in the odd columns and a plurality of second blind holes located in the even columns, any of the first blind holes is located between the blue sub-pixel and the red sub-pixel, and any of the second blind holes is located between two of the green sub-pixels, wherein a cross-sectional area of the second blind hole is greater than a cross-sectional area of the first blind hole.

12. The OLED display device according to claim 11, wherein the bottom of the blind hole is located on a surface of a side of the substrate close to the TFT array layer.

13. The OLED display device according to claim 11, wherein the OLED display panel further comprises a planarization layer located between the TFT array layer and the plurality of light-emitting sub-pixels, a pixel electrode layer between the planarization layer and the plurality of light-emitting sub-pixels, and a pixel definition layer located on the planarization layer and the pixel electrode layer.

14. The OLED display device according to claim 13, wherein the blind hole penetrates through the planarization layer and the pixel definition layer.

15. The OLED display device according to claim 11, wherein a cross-sectional shape of the blind hole is one or more of a circle, a rounded rectangle, a rectangle and an ellipse.

* * * * *